United States Patent
Zhang et al.

(10) Patent No.: US 11,315,487 B2
(45) Date of Patent: Apr. 26, 2022

(54) PIXEL DRIVING CIRCUIT AND DISPLAY PANEL

(71) Applicant: Shenzhen China Star Optoelectronics Semiconductor Display Technology Co., Ltd., Shenzhen (CN)

(72) Inventors: Lijun Zhang, Shenzhen (CN); Shujhih Chen, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 255 days.

(21) Appl. No.: 16/627,794

(22) PCT Filed: Dec. 30, 2019

(86) PCT No.: PCT/CN2019/129728
§ 371 (c)(1),
(2) Date: Dec. 31, 2019

(87) PCT Pub. No.: WO2021/120320
PCT Pub. Date: Jun. 24, 2021

(65) Prior Publication Data
US 2021/0358409 A1 Nov. 18, 2021

(30) Foreign Application Priority Data
Dec. 20, 2019 (CN) .......................... 201911330186.6

(51) Int. Cl.
*G09G 3/3233* (2016.01)
*G09G 3/3275* (2016.01)
*H01L 29/786* (2006.01)

(52) U.S. Cl.
CPC ......... *G09G 3/3233* (2013.01); *G09G 3/3275* (2013.01); *H01L 29/7869* (2013.01);
(Continued)

(58) Field of Classification Search
CPC ............... G09G 3/3233; G09G 3/3275; G09G 2300/0439; G09G 2300/0809;
(Continued)

(56) References Cited

U.S. PATENT DOCUMENTS

2017/0221420 A1* 8/2017 Zhu ........................ G09G 3/3233
2018/0005572 A1 1/2018 Ka et al.
(Continued)

FOREIGN PATENT DOCUMENTS

CN 105825815 8/2016
CN 107564467 1/2018
(Continued)

OTHER PUBLICATIONS

Machined English Translation CN 109147648, Oct. 29, 2021, pp. 1-15 (Year: 2021).*
(Continued)

*Primary Examiner* — Jimmy H Nguyen (57) ABSTRACT

A pixel driving circuit and a display panel are provided. The pixel driving circuit includes a source of a second thin film transistor electrically connected to a drain of a first thin film transistor, a gate of a sixth thin film transistor configured to receive a third control signal, a source of the sixth thin film transistor electrically connected to a second node, and a drain of the sixth thin film transistor electrically connected to an anode of a light emitting device.

10 Claims, 6 Drawing Sheets

(52) U.S. Cl.
CPC .. *H01L 29/78618* (2013.01); *H01L 29/78663* (2013.01); *H01L 29/78672* (2013.01)

(58) Field of Classification Search
CPC ......... H01L 29/78618; H01L 29/78663; H01L 29/78672; H01L 29/7869
USPC .................................................. 345/204, 76
See application file for complete search history.

(56) References Cited

U.S. PATENT DOCUMENTS

2018/0301092 A1\* 10/2018 Ma ........................ G09G 3/3233
2019/0019453 A1   1/2019 Chen
2020/0043410 A1   2/2020 Ka et al.

FOREIGN PATENT DOCUMENTS

| | | |
|---|---|---|
| CN | 109147648 | 1/2019 |
| CN | 109584801 | 4/2019 |
| CN | 110322836 | 10/2019 |
| KR | 10-2017-0132598 | 12/2017 |

OTHER PUBLICATIONS

Machined English Translation CN 105825815, Oct. 29, 2021, pp. 1-7 (Year: 2021).\*

\* cited by examiner

PIXEL DRIVING CIRCUIT AND DISPLAY PANEL

RELATED APPLICATIONS

This application is a National Phase of PCT Patent Application No. PCT/CN2019/129728 having International filing date of Dec. 30, 2019, which claims the benefit of priority of Chinese Patent Application No. 201911330186.6 filed on Dec. 20, 2019. The contents of the above applications are all incorporated by reference as if fully set forth herein in their entirety.

FIELD AND BACKGROUND OF THE INVENTION

The present disclosure relates to display technologies, and more particularly, to a pixel driving circuit and a display panel.

BACKGROUND

Figure 1:
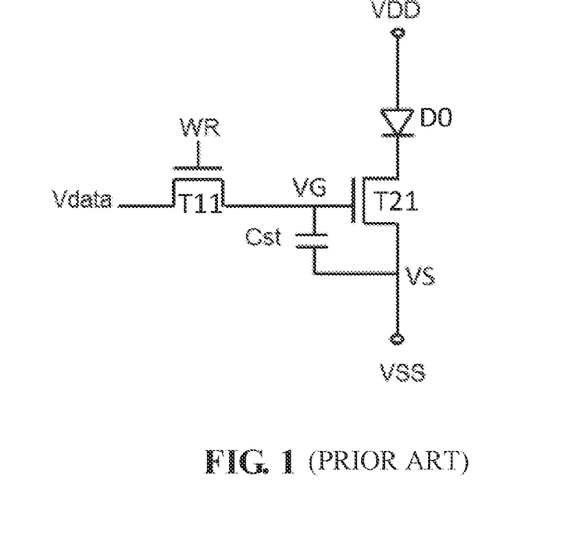
FIG. 1 is a schematic view of a structure of a pixel driving circuit according to prior art.
Figure 2:
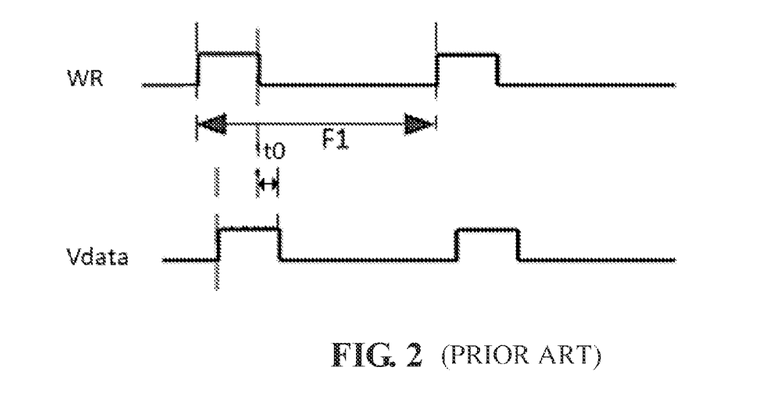
FIG. 2 is a schematic view of a time sequence of a pixel driving circuit according to prior art.

As shown in FIG. 1 and FIG. 2, the prior art pixel driving circuit is a 2T1C structure, which includes a first thin film transistor T11 and a second thin film transistor T21. During a working process, within one frame (F1), when a WR is at a high electrical level, the T11 is turned on, and a Vdata signal is written to one end of Cst. The data signal Vdata is delayed by t0 from the WR. When the WR is at a low electrical level, the T11 is turned off. The Cst stores the potential of Vdata until the T11 is turned on again to write a new Vdata signal. However, at the moment when the Vdata signal is written, a current flows through the light-emitting device D0, and its current (I=½K $(V_{GS}-Vth)^2$) lights up the light-emitting device. Different gray levels can be displayed according to different Vdata values. It can be seen from the above formula that the current value of the light emitting device (ie, the brightness of the LED) is related to the gate-drain voltage $V_{GS}$ and the threshold voltage Vth of the T21.

However, due to the limitation of the thin-film transistor manufacturing process, the Vth (threshold voltage) of the second thin-film transistor corresponding to different pixels cannot be guaranteed to be completely the same. Even under the condition of inputting the same other signal, the current flowing through the light-emitting diode will be different. It results in different brightness. Macroscopically, mura is generated, which affects the display effect.

Therefore, there is a need provide a pixel driving circuit to solve the above issues.

SUMMARY OF THE INVENTION

In view of the above, the present disclosure provides a pixel driving circuit and a display panel to prevent from mura and enhance a display effect.

In order to achieve above-mentioned object of the present disclosure, one embodiment of the disclosure provides a pixel driving circuit, including a first thin film transistor, a second thin film transistor, a third thin film transistor, a sixth thin film transistor, a first capacitor, and a light emitting device.

A gate of the third thin film transistor is configured to receive a first control signal, a source of the third thin film transistor is configured to receive a data signal, and a drain of the third thin film transistor is electrically connected to a first node.

A gate of the first thin film transistor is configured to receive a third control signal, and a source of the first thin film transistor is configured to receive a first power voltage.

A gate of the second thin film transistor is electrically connected to the first node, a drain of the second thin film transistor is electrically connected to a second node, and a source of the second thin film transistor is electrically connected to a drain of the first thin film transistor.

A gate of the sixth thin film transistor is configured to receive the third control signal, a source of the sixth thin film transistor is electrically connected to the second node, and a drain of the sixth thin film transistor is electrically connected to an anode of the light emitting device.

A cathode of the light emitting device is connected to a second power voltage.

An end of the first capacitor is electrically connected to the first node, and another end of the first capacitor is electrically connected to the second node.

Furthermore, another embodiment of the disclosure provides a display panel includes the pixel driving circuit abovementioned.

In comparison with prior art, the pixel driving circuit and the display panel provides promotions on the prior art pixel driving circuit to make a current passing through the light emitting device not depend on a threshold voltage to avoid from mura and enhance a display effect.

DESCRIPTION OF SPECIFIC EMBODIMENTS OF THE INVENTION

The following description of the embodiments is provided by reference to the drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Referring to FIG. 1, a gate of a first thin film transistor T11 is configured to receive a control signal WR, a source is configured to receive data signal Vdata, and a drain is connected to a gate of a second thin film transistor T21. An anode of a light emitting device D0 is configured to receive first power voltage VDD, a cathode is connected to a source of the second thin film transistor T21. A drain of the second thin film transistor T21 is connected to a second power voltage VSS. An end of a capacitor Cst is connected to the gate of the second thin film transistor T21, another end of the capacitor Cst is connected to the drain of the second thin film transistor T21. A voltage of the gate and a voltage of the drain of the second thin film transistor T21 are VG and VS respectively.

Figure 3:
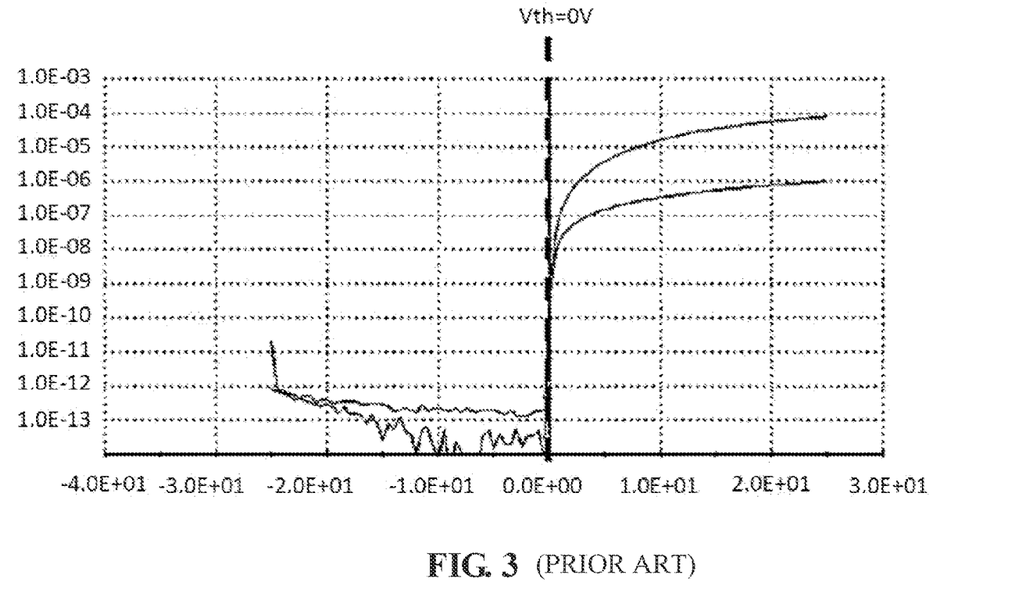
FIG. 3 is a schematic view of a first characteristic curve of a second thin film transistor according to prior art.
Figure 4:
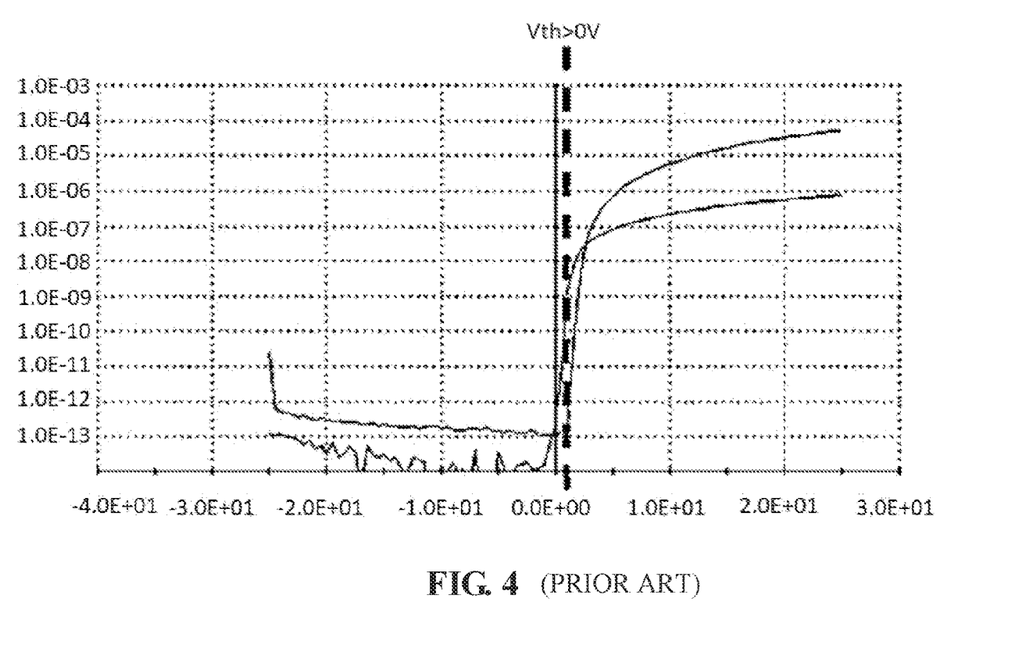
FIG. 4 is a schematic view of a second characteristic curve of a second thin film transistor according to prior art.

Taking the following second thin film transistors corresponding to two pixels as an example, the threshold voltage Vth of the second thin film transistor corresponding to one pixel is 0, and the threshold voltage Vth of the second thin film transistor corresponding to the other pixel is greater than 0. The characteristic curves of the two are shown in FIG. 3 and FIG. 4. The abscissa in FIG. 3 and FIG. 4 represents a VGS voltage. The unit is V. The ordinate represents a current IDS flowing through a light-emitting diode (LED). The unit is A, that is, under the conditions for inputting the same other signals, the current flowing through the LED will also be different, resulting in different brightness.

Referring to FIG. 5 to FIG. 12, one embodiment of the disclosure provides a pixel driving circuit, including a first thin film transistor T1, a second thin film transistor T2, a third thin film transistor T3, a sixth thin film transistor T6, a first capacitor Cst, and a light emitting device D1.

Figure 5:
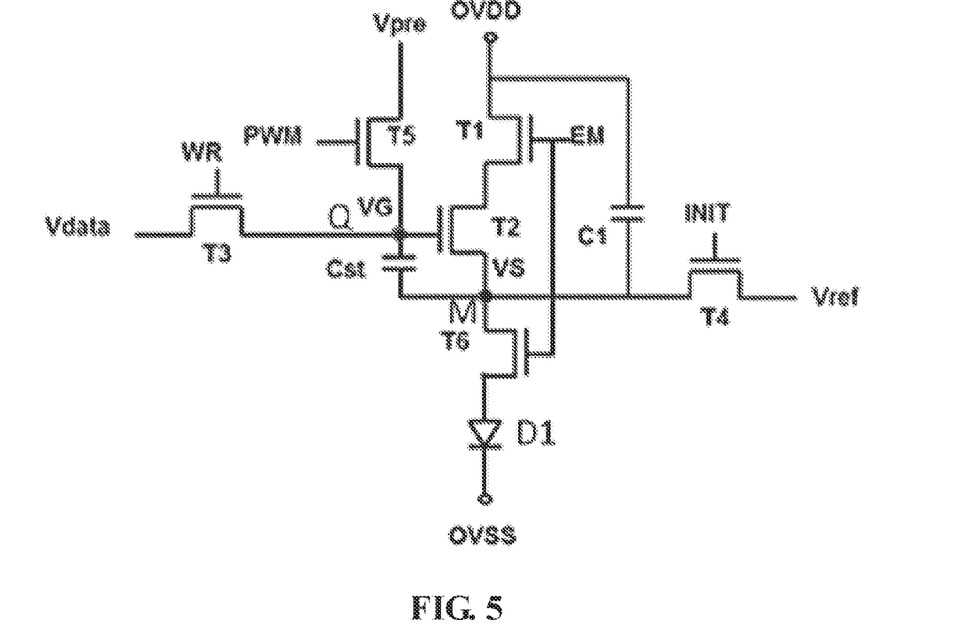
FIG. 5 is a schematic view of a structure of a pixel driving circuit according to an embodiment of the present disclosure.

A gate of the third thin film transistor T3 is configured to receive a first control signal WR, a source of the third thin film transistor T3 is configured to receive a data signal Vdata, and a drain of the third thin film transistor T3 is electrically connected to a first node Q.

A gate of the first thin film transistor T1 is configured to receive a third control signal EM, and a source of the first thin film transistor T1 is configured to receive a first power voltage OVDD.

A gate of the second thin film transistor T2 is electrically connected to the first node Q, a drain of the second thin film transistor T2 is electrically connected to a second node M, and a source of the second thin film transistor T2 is electrically connected to a drain of the first thin film transistor T1.

A gate of the sixth thin film transistor T6 is configured to receive the third control signal EM, a source of the sixth thin film transistor T6 is electrically connected to the second node M, and a drain of the sixth thin film transistor T6 is electrically connected to an anode of the light emitting device D1.

A cathode of the light emitting device D1 is connected to a second power voltage OVSS. In one embodiment of the disclosure, the light emitting device D1 can be an organic light emitting diode. The first power voltage OVDD and the second power voltage OVSS both are direct current. The first power voltage OVDD is greater than the second power voltage OVSS. In one embodiment of the disclosure, the light emitting device D1 is an organic light emitting diode.

An end of the first capacitor Cst is electrically connected to the first node Q, and another end of the first capacitor Cst is electrically connected to the second node M.

In one embodiment of the disclosure, the pixel driving circuit further includes a fifth thin film transistor T5.

A gate of the fifth thin film transistor T5 is configured to receive a second control signal PWM, a source of the fifth thin film transistor T5 is configured to receive a first reference voltage Vpre, and a drain of the fifth thin film transistor T5 is electrically connected to the first node Q.

In one embodiment of the disclosure, the pixel driving circuit further includes a fourth thin film transistor T4 and a second capacitor C1.

A gate of the fourth thin film transistor T4 is configured to receive a fourth control signal INIT, a source of the fourth thin film transistor T4 is configured to receive a second reference voltage Vref, and a drain of the fourth thin film transistor T4 is electrically connected to the second node M. The fourth control signal INIT can be an initial signal. The first reference Vpre and the second reference Vref both are constant voltages.

An end of the second capacitor C1 is electrically connected to the source of the first thin film transistor T1, and another end of the second capacitor C1 is electrically connected to the drain of the fourth thin film transistor T4.

In one embodiment of the disclosure, the first thin film transistor T1, the second thin film transistor T2, the third thin film transistor T3, the fourth thin film transistor T4, the fifth thin film transistor T5, and the sixth thin film transistor T6 all are at least one type of a low temperature poly-silicon thin film transistor, a oxide semiconductor thin film transistor, and an amorphous silicon thin film transistor.

In one embodiment of the disclosure, the first control signal WR, the second control signal PWM, the third control signal EM, and the fourth control signal INIT all provided by an outside time controller.

In one embodiment of the disclosure, the first thin film transistor T1, the second thin film transistor T2, the third thin film transistor T3, the fourth thin film transistor T4, the fifth thin film transistor T5, and the sixth thin film transistor T6 all are N-type thin film transistors.

Figure 6:
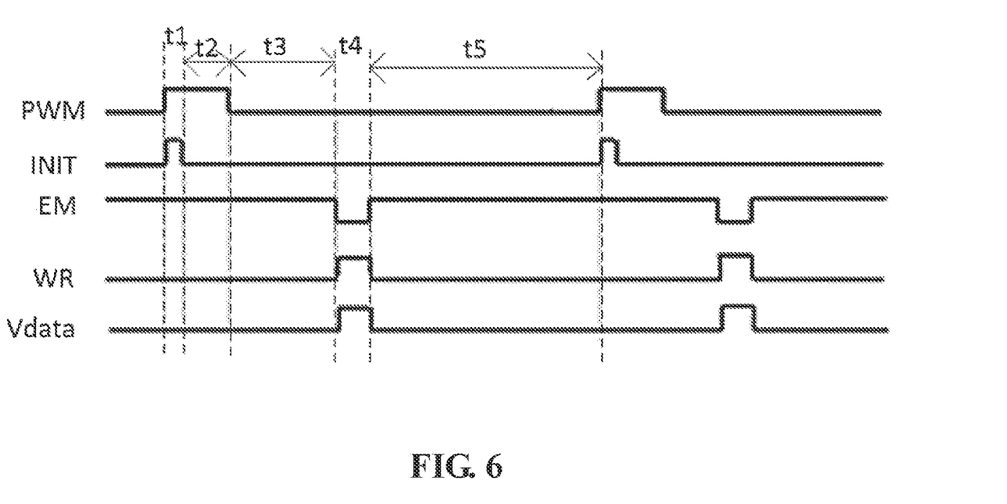
FIG. 6 is a schematic view of a time sequence of a pixel driving circuit according to an embodiment of the present disclosure.

A combination of the first control signal WR, the second control signal PWM, the third control signal EM, and the fourth control signal INIT is corresponding to an initial phase, a threshold voltage storage phase, a modulating phase, a data writing phase, and a light emitting display phase.

Referring to FIG. 6, the second control signal PWM, the third control signal EM, and the fourth control signal INIT all are at a high level, and the first control signal WR is at a low level in the initial phase t1.

The second control signal PWM and the third control signal EM both are at the high level, and the fourth control signal INIT and the first control signal WR both are at the low level in the threshold voltage storage phase t2.

The first control signal WR, the second control signal PWM, and the fourth control signal INIT all are at the low level, and the third control signal EM is at the high level in the modulating phase t3.

The second control signal PWM, the third control signal EM, and the fourth control signal INIT all are at the low level, and the first control signal WR is at the high level in the data writing phase t4.

The first control signal WR, the second control signal PWM, and the fourth control signal INIT all are at the low level, and the third control signal EM is at the high level in the light emitting phase t5.

The data signal Vdata is at a high level when the first control signal WR is at the high level.

Figure 7:
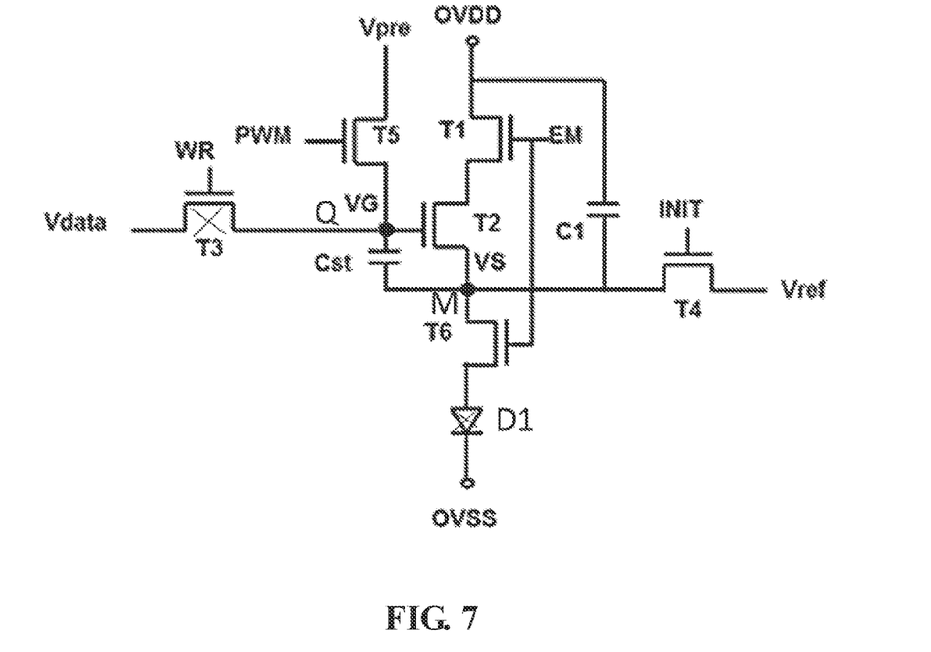
FIG. 7 is a schematic view of a structure of a pixel driving circuit in an initial phase according to an embodiment of the present disclosure.

In a detail working process, take a frame as an example:

Referring to FIG. 7 and FIG. 6, in the initial phase, the voltage of VG, and VS are reset. Because the fourth control signal INIT and the second control signal PWM both are at the high level, the T4, and T5 are turned on simultaneously to write the Vpre to the gate of the second thin film transistor T2. VG is equal to Vpre. The Vref is written to the drain of the second thin film transistor T2, then the VS is equal to Vref. The potential of the Vref will turn off the D1 lighting in the previous frame. The first control signal WR is at the low level, and then the T3 turns off.

Figure 8:
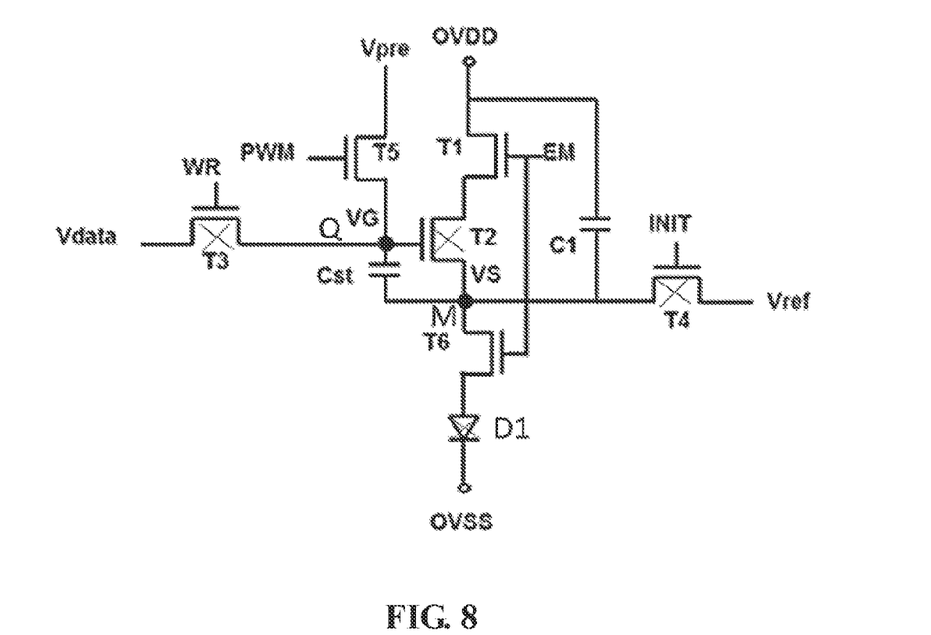
FIG. 8 is a schematic view of a structure of a pixel driving circuit in a threshold voltage storage phase according to an embodiment of the present disclosure.

In the threshold voltage storage phase, as shown in FIG. 8, the fourth control signal INIT is at the low level, and the T4 is turned off. The voltage of VS is floating. Because the third control signal EM is at the high level, the T1 is turned on and the VG is at the high level. The T2 is starting to turn on. The OVDD charges the drain S of the T2 through the T1, and the T2 until the drain voltage VS equals to Vpre-Vth. At the time, the T2 is turned off, and a voltage of the VS includes messages of Vth.

Figure 9:
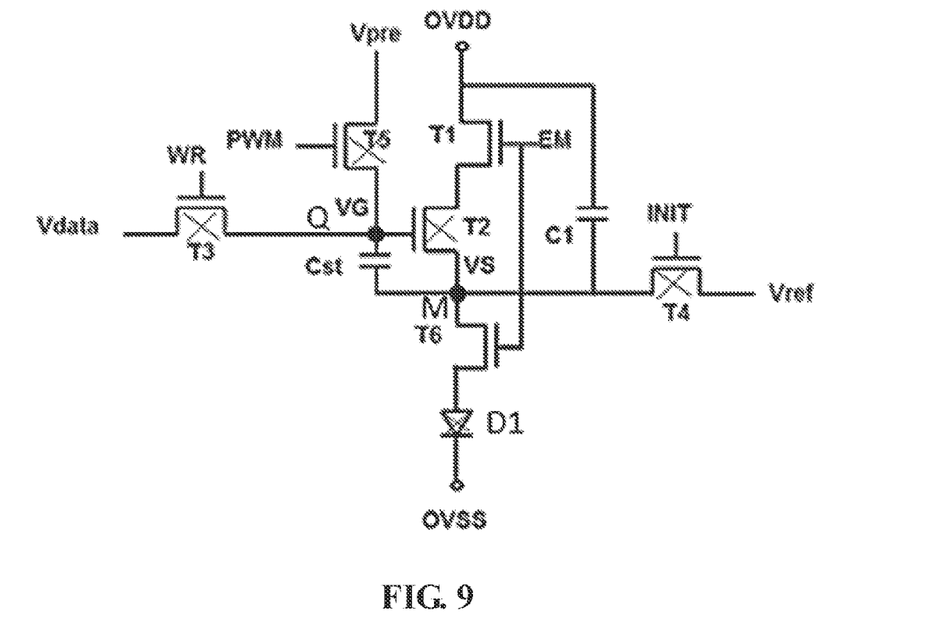
FIG. 9 is a schematic view of a structure of a pixel driving circuit in a modulating phase according to an embodiment of the present disclosure.

In the modulating phase, as shown in FIG. 9, the second control signal PWM is at the low level. The T5 is turned off. Voltages in the pixel driving circuit have no change. This phase is mainly used to adjust the proportion of light emission time (that is, the longer the duration of this phase, the shorter the proportion of light emitting phase, and the lower the accumulated brightness), so as to achieve a function of brightness adjustment.

Figure 10:
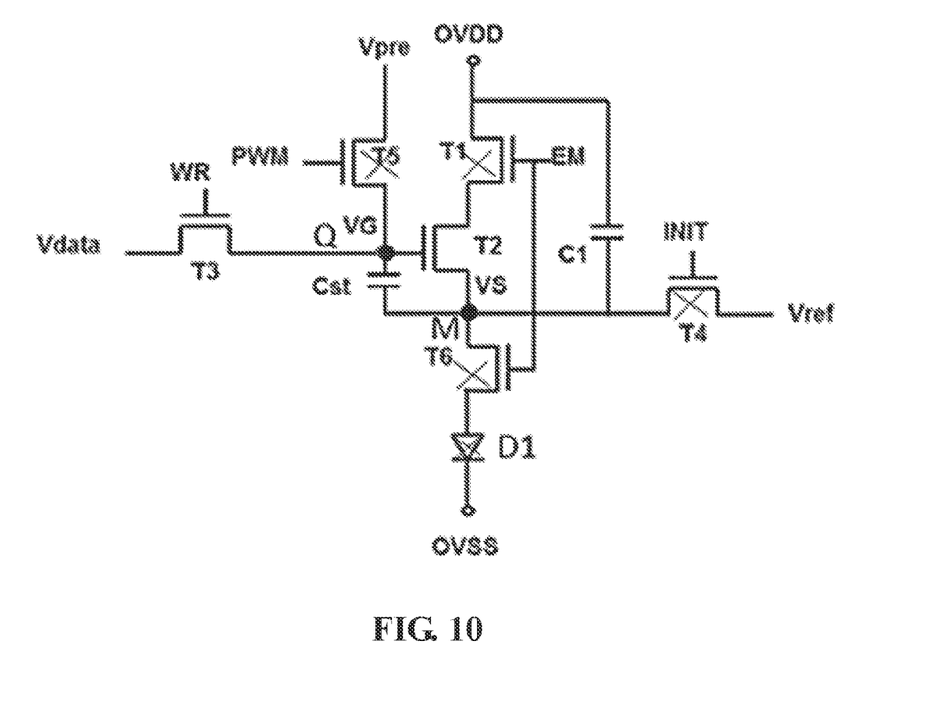
FIG. 10 is a schematic view of a structure of a pixel driving circuit in a data writing phase and light emitting display phase according to an embodiment of the present disclosure.

In the data writing phase, as shown in FIG. 10, the first control signal WR is at the high level, the T3 is turned on to write the Vdata to the gate of the T2. The VG equals to Vdata. Data signal Vdata is also at the high level. The T2 is turned on. The third control signal EM is at the low level. At this time, the T1 and the T6 both are turned off. Because the voltage of the VS is floating and changing according to a coupling the Cst and the C1. The VS after steady includes the Vth, too. The T6 is configured to keep the D1 turned off.

Figure 11:
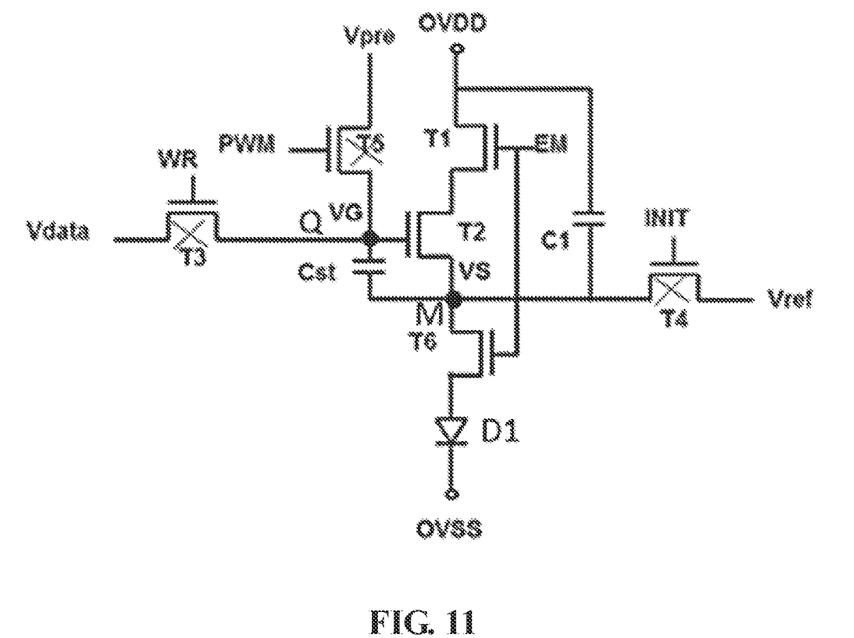
FIG. 11 is a schematic view of a structure of a pixel driving circuit in the light emitting display phase according to an embodiment of the present disclosure.

In the light emitting phase, as shown in FIG. 11, because the first control signal WR is at the low level, the T3 is turned off. The third control signal EM is at the high level, so the T1 and the T6 is turned on, and the D1 is emitting light. At this time, voltages of the gate and the drain of the T2 is the same as that in the data writing phase.

A voltage V1 between two ends of the diode D1 is as following:

$$V1=VGS-Vth-OVSS=VG-VS-Vth-OVSS=\text{Vdata}-(Vpre-Vth)-Vth-OVSS=\text{Vdata}-Vpre-OVSS$$

A current I of D1 is that: $I=\frac{1}{2}K(\text{Vdata}-Vpre-OVSS)^2$

The Vth in VGS is cancel, and the current passing the light emitting device is nothing about the Vth.

Figure 12:
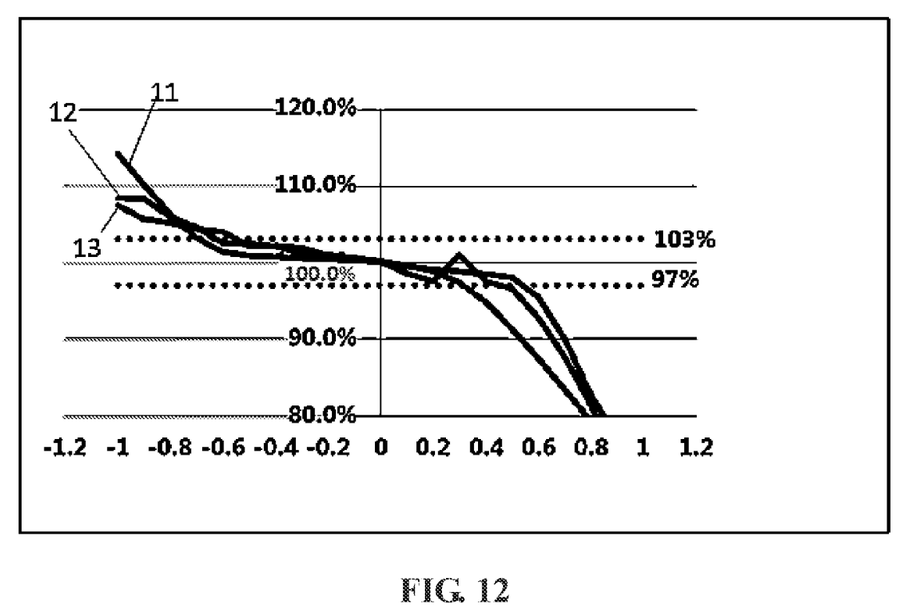
FIG. 12 is a schematic view of current of pixels with different colors of a pixel driving circuit according to an embodiment of the present disclosure.

As shown in FIG. 12, a relationship diagram of percent of current changing to ΔVth of a red light emitting device 11, a blue light emitting device 12, and a green light emitting device 13 are shown. The abscissa represents ΔVth and the ordinate represents a percent of current changing. When ΔVth ranges within −0.6 to 0.4, the current changing ranges within 3%. An effect of the Vth to the current is reduced to avoid from mura and enhance a display effect.

Furthermore, another embodiment of the disclosure provides a display panel includes the pixel driving circuit abovementioned.

In comparison with prior art, the pixel driving circuit and the display panel provides promotions on the prior art pixel driving circuit to make a current passing through the light emitting device not depend on a threshold voltage to avoid from mura and enhance a display effect.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A pixel driving circuit, comprising a first thin film transistor, a second thin film transistor, a third thin film transistor, a fourth thin film transistor, a fifth thin film transistor, a sixth thin film transistor, a first capacitor, and a light emitting device;

wherein a gate of the third thin film transistor is configured to receive a first control signal, a source of the third thin film transistor is configured to receive a data signal, and a drain of the third thin film transistor is electrically connected to a first node;

wherein a gate of the first thin film transistor is configured to receive a third control signal, and a source of the first thin film transistor is configured to receive a first power voltage;

wherein a gate of the second thin film transistor is electrically connected to the first node, a drain of the second thin film transistor is electrically connected to a second node, and a source of the second thin film transistor is electrically connected to a drain of the first thin film transistor;

wherein a gate of the sixth thin film transistor is configured to receive the third control signal, a source of the sixth thin film transistor is electrically connected to the second node, and a drain of the sixth thin film transistor is electrically connected to an anode of the light emitting device;

wherein a cathode of the light emitting device is connected to a second power voltage;

wherein an end of the first capacitor is electrically connected to the first node, and another end of the first capacitor is electrically connected to the second node;

wherein a gate of the fifth thin film transistor is configured to receive a second control signal, a source of the fifth thin film transistor is configured to receive a first reference voltage, and a drain of the fifth thin film transistor is electrically connected to the first node;

wherein a gate of the fourth thin film transistor is configured to receive a fourth control signal, a source of the fourth thin film transistor is configured to receive a second reference voltage, and a drain of the fourth thin film transistor is electrically connected to the second node;

wherein a combination of the first control signal, the second control signal, the third control signal, and the fourth control signal is corresponding to an initial phase, a threshold voltage storage phase, a modulating phase, a data writing phase, and a light emitting display phase;

wherein the second control signal, the third control signal, and the fourth control signal all are at a high level, and the first control signal is at a low level in the initial phase;

the second control signal and the third control signal both are at the high level, and the fourth control signal and the first control signal both are at the low level in the threshold voltage storage phase;

the first control signal, the second control signal, and the fourth control signal all are at the low level, and the third control signal is at the high level in the modulating phase;

the second control signal, the third control signal, and the fourth control signal all are at the low level, and the first control signal is at the high level in the data writing phase; and the first control signal, the second control signal, and the fourth control signal all are at the low level, and the third control signal is at the high level in the light emitting phase.

2. The pixel driving circuit according to claim 1, further comprising a second capacitor;

wherein an end of the second capacitor is electrically connected to the source of the first thin film transistor, and another end of the second capacitor is electrically connected to the drain of the fourth thin film transistor.

3. The pixel driving circuit according to claim 1, wherein the first thin film transistor, the second thin film transistor, the third thin film transistor, the fourth thin film transistor, the fifth thin film transistor, and the sixth thin film transistor all are N-type thin film transistors.

4. Tire pixel driving circuit according to claim 1, wherein the data signal is at a high level when the first control signal is at the high level.

5. The pixel driving circuit according to claim 1, wherein the light emitting device is an organic light emitting diode.

6. A display panel, comprising a pixel driving circuit, wherein the pixel driving circuit comprises a first thin film transistor, a second thin film transistor, a third thin film transistor, a fourth thin film transistor, a fifth thin film transistor, a sixth thin film transistor, a first capacitor, and a light emitting device;

wherein a gate of the third thin film transistor is configured to receive a first control signal, a source of the third thin film transistor is configured to receive a data signal, and a drain of the third thin film transistor is electrically connected to a first node;

wherein a gate of the first thin film transistor is configured to receive a third control signal, and a source of the first thin film transistor is configured to receive a first power voltage;

wherein a gate of the second thin film transistor is electrically connected to the first node, a drain of the second thin film transistor is electrically connected to a second node, and a source of the second thin film transistor is electrically connected to a drain of the first thin film transistor;

wherein a gate of the sixth thin film transistor is configured to receive the third control signal, a source of the sixth thin film transistor is electrically connected to the second node, and a drain of the sixth thin film transistor is electrically connected to an anode of the light emitting device;

wherein a cathode of the light emitting device is connected to a second power voltage;

wherein an end of the first capacitor is electrically connected to the first node, and another end of the first capacitor is electrically connected to the second node;

wherein agate of the fifth thin film transistor is configured to receive a second control signal, a source of the fifth thin film transistor is configured to receive a first reference voltage, and a drain of the fifth thin film transistor is electrically connected to the first node;

wherein a gate of the fourth thin film transistor is configured to receive a fourth control signal, a source of the fourth thin film transistor is configured to receive a second reference voltage, and a drain of the fourth thin film transistor is electrically connected to the second node;

wherein a combination of the first control signal, the second control signal, the third control signal, and the fourth control signal is corresponding to an initial phase, a threshold voltage storage phase, a modulating phase, a data writing phase, and a light emitting display phase;

wherein the second control signal, the third control signal, and the fourth control signal all are at a high level, and the first control signal is at a low level in the initial phase;

the second control signal and the third control signal both are at the high level, and the fourth control signal and the first control signal both are at the low level in the threshold voltage storage phase;

the first control signal, the second control signal, and the fourth control signal all are at the low level, and the third control signal is at the high level in the modulating phase;

the second control signal, the third control signal, and the fourth control signal all are at the low level, and the first control signal is at the high level in the data writing phase; and the first control signal, the second control signal, and the fourth control signal all are at the low level, and the third control signal is at the high level in the light emitting phase.

7. They display panel according to claim 6, further comprising a second capacitor;

wherein an end of the second capacitor is electrically connected to the source of the first thin film transistor, and another end of the second capacitor is electrically connected to the drain of the fourth thin film transistor.

8. The display panel according to claim 6, wherein the first thin film transistor, the second thin film transistor, the third thin film transistor, the fourth thin film transistor, the fifth thin film transistor, and the sixth thin film transistor all are N-type thin film transistors.

9. The display panel according to claim 6, wherein the data signal is at a high level when the first control signal is at the high level.

10. The display panel according to claim 6, wherein the light emitting device is an organic light emitting diode.

* * * * *